United States Patent
Lee et al.

(10) Patent No.: US 11,393,745 B2
(45) Date of Patent: Jul. 19, 2022

(54) SEMICONDUCTOR PACKAGES WITH EMBEDDED INTERCONNECTS

(71) Applicant: Intel Corporation, Santa Clara, CA (US)

(72) Inventors: Kyu Oh Lee, Chandler, AZ (US);
Dilan Seneviratne, Chandler, AZ (US);
Ravindranadh T Eluri, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,770

(22) PCT Filed: Sep. 29, 2017

(86) PCT No.: PCT/US2017/054524
§ 371 (c)(1),
(2) Date: Feb. 27, 2020

(87) PCT Pub. No.: WO2019/066943
PCT Pub. Date: Apr. 4, 2019

(65) Prior Publication Data
US 2021/0082797 A1    Mar. 18, 2021

(51) Int. Cl.
*H01L 23/498*    (2006.01)
*H01L 21/48*    (2006.01)
*H01L 23/00*    (2006.01)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ........... H01L 23/49822; H01L 21/4857; H01L 21/486; H01L 23/49811; H01L 23/49827; H01L 24/13; H01L 24/16
See application file for complete search history.

(56) References Cited

U.S. PATENT DOCUMENTS 6,828,510 B1 * 12/2004 Asai .................. H05K 3/387
174/255
9,549,468 B1 * 1/2017 Tsai .................. H05K 3/0017
(Continued)

FOREIGN PATENT DOCUMENTS

CN    111052364    4/2020
WO    WO-2012006063 A2    1/2012
(Continued)

OTHER PUBLICATIONS

"International Application Serial No. PCT US2017 054524, International Preliminary Report on Patentability dated Apr. 9, 2020", 13 pgs.
(Continued)

*Primary Examiner* — Douglas W Owens
(74) *Attorney, Agent, or Firm* — Schwegman Lundberg & Woessner, P.A.

(57) ABSTRACT

A semiconductor package may include a semiconductor package first side, an embedded bridge interconnect, a first via, and a second via. The bridge interconnect may include a bridge interconnect first side with a conductive pad and a bridge interconnect second side. The distance between the bridge interconnect first side and the semiconductor package first side may be less than a distance between the bridge interconnect second side and the semiconductor package first side. The first and second vias may each include a first end that is narrower than a second end. The semiconductor package first side may be closer to the first end of the first via than the second end of the first via, and closer to the second end of the second via than the first end of the second via. The first side of the semiconductor package may be configured to electrically couple to a die.

18 Claims, 12 Drawing Sheets

(52) U.S. Cl.
CPC .. *H01L 23/49811* (2013.01); *H01L 23/49827* (2013.01); *H01L 24/13* (2013.01); *H01L 24/16* (2013.01); *H01L 2224/13147* (2013.01); *H01L 2224/16235* (2013.01); *H01L 2924/014* (2013.01)

(56) References Cited

U.S. PATENT DOCUMENTS

| | | | |
|---|---|---|---|
| 2008/0107863 A1* | 5/2008 | Ikeda | H01L 21/4857 428/137 |
| 2011/0147055 A1* | 6/2011 | Ma | H01L 21/4803 174/255 |
| 2011/0147061 A1* | 6/2011 | Leung | H01L 23/49822 174/260 |
| 2011/0156231 A1 | 6/2011 | Guzek | |
| 2015/0001717 A1 | 1/2015 | Karhade et al. | |
| 2015/0279817 A1 | 10/2015 | Zhang et al. | |
| 2016/0064329 A1 | 3/2016 | Lee et al. | |
| 2016/0133555 A1* | 5/2016 | Nakamura | H05K 3/427 257/774 |
| 2016/0150651 A1* | 5/2016 | Tsai | H01L 21/4857 174/251 |
| 2016/0240463 A1* | 8/2016 | Jow | H01L 23/49822 |
| 2017/0271264 A1 | 9/2017 | Lee | |
| 2017/0271266 A1* | 9/2017 | Kim | H01L 24/97 |
| 2018/0005934 A1* | 1/2018 | Brunschwiler | H01L 23/50 |
| 2018/0019197 A1* | 1/2018 | Boyapati | H01L 23/49838 |
| 2018/0145017 A1* | 5/2018 | Tsai | H01L 23/49822 |
| 2019/0393143 A1* | 12/2019 | Rosch | H01L 23/49827 |

FOREIGN PATENT DOCUMENTS

| | | |
|---|---|---|
| WO | WO-2015130264 A1 | 9/2015 |
| WO | WO-2016043779 A1 | 3/2016 |
| WO | WO-2017111957 A1 | 6/2017 |
| WO | WO-2019066943 A1 | 4/2019 |

OTHER PUBLICATIONS

"International Application Serial No. PCT/US2017/054524, International Search Report dated Jun. 28, 2018", 4 pgs.

"International Application Serial No. PCT/US2017/054524, Written Opinion dated Jun. 28, 2018", 11 pgs.

"European Application Serial No. 17926457.7, Extended European Search Report dated Apr. 15, 2021", 8 pgs.

* cited by examiner

SEMICONDUCTOR PACKAGES WITH EMBEDDED INTERCONNECTS

This application is a U.S. National Stage Filing under 35 U.S.C. 371 from International Application No. PCT/US2017/054524, filed Sep. 29, 2017 and published in English as WO 2019/066943 on Apr. 4, 2019, which is incorporated herein by reference in its entirety.

TECHNICAL FIELD

The present disclosure relates generally to the field of semiconductor packages, and more particularly, to semiconductor packages with embedded bridge interconnects.

BACKGROUND

An integrated circuit device may include electrical contacts that may be used to couple the device to another component. However, if substrate coplanarity is not achieved, it may be difficult to form the desired electrical connections between the device and the other component.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Figure 1:
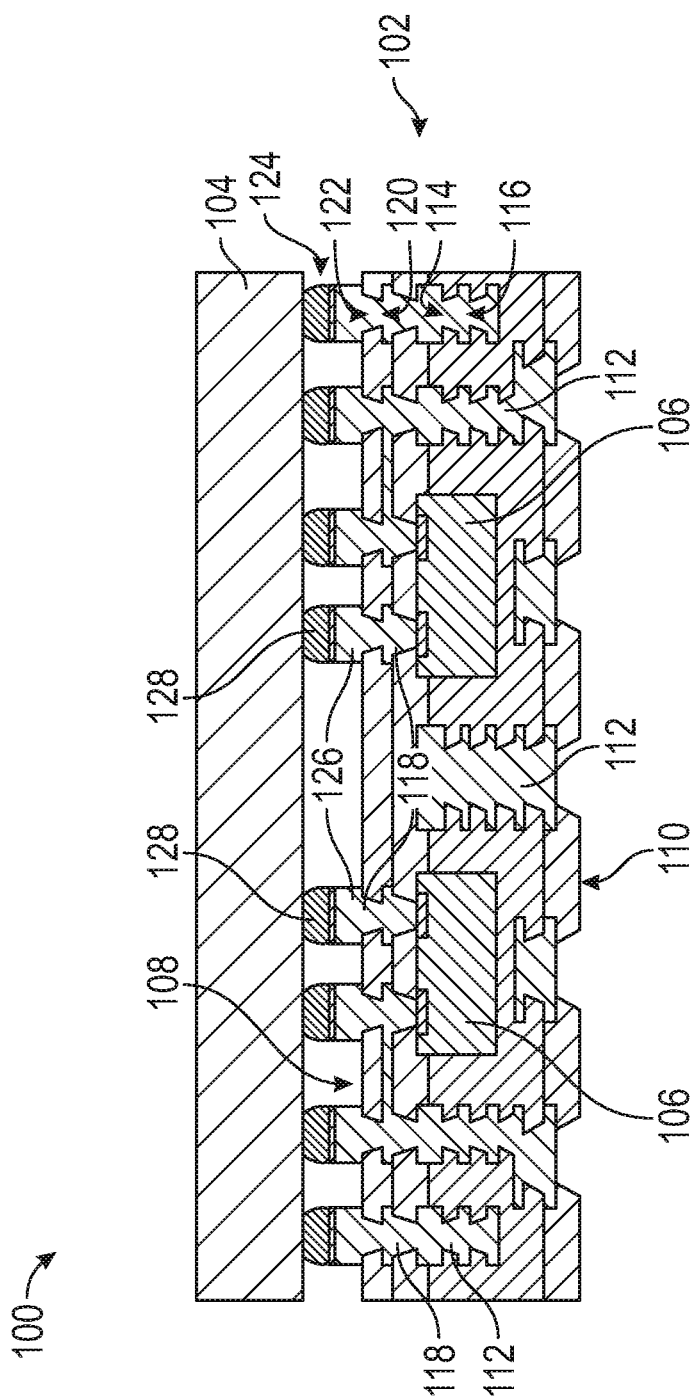
FIG. 1 illustrates a side, cross-sectional view of an integrated circuit assembly, in accordance with various embodiments.

As die placement tolerances tighten, thermal compression bonding is becoming more common, which introduces new challenges with regards to the flatness of the substrate. Typically, the thermal compression bonding bond head places a die onto a substrate to be bonded together, the substrate is attached to a pedestal through an applied vacuum pulling the back side of the substrate. As the vacuum pulls the substrate flat at the "bottom" side, the "top" substrate coplanarity is inherent to the substrate thickness variation. The "top" substrate coplanarity under vacuum pedestal is key to the success of the thermal compression bonding process. However, it can be quite challenging to meet the substrate coplanarity requirement due to inherent substrate manufacturing variance associated with organic lamination process.

Conventionally, substrate thickness variation reduction methods focus on the copper metal density, copper plating, and build-up lamination process optimization. However, these conventional methods cannot completely solve the coplanarity issues, since there will always be some inherent variation on the "top" and "bottom" side of the substrate from the copper plating process, build-up material lamination process, solder resist material variation, core variation, and pattern plating material variation. For flip-chip structures, it may be nearly impossible to provide an end of line substrate with little to no variation (i.e., good top coplanarity) as may be required in certain applications. Moreover, conventional methods can significantly reduce substrate design flexibility and potentially increase the substrate manufacturing cost for the dedicated copper and build-up laminating process.

Various embodiments disclosed herein include methods for the manufacture of semiconductor packages and integrated circuit assemblies that use coreless processing techniques to fabricate components having very good top coplanarity (e.g., with very small or almost zero variation). This top coplanarity may enable the use of thermal compression bonding in the die attachment process, even at extremely fine features spacing (e.g., bump pitch below 100 microns).

In some embodiments, the semiconductor packages disclosed herein may use the surface of a first build-up layer laminated onto a peelable sacrificial core as a "C4" or flip-chip connection side. An interconnect (e.g., a silicon bridge interconnect) may be embedded in a cavity (formed, e.g., by a laser or lithographic process after formation of a first or second metal layer) and the cavity may be filled using a build-up resin or other material between the interconnect and the cavity. By using the surface of the first build-up layer as the C4 side, the C4 side will be as flat as the profile of the surface of the peelable sacrificial core. A flat C4 surface enables the formation of fine microvias on the subsequent build-up which can be essential for fine bump pitch (e.g., bump pitch less than 55 microns), for use in embedded interconnect devices.

The package, once detached from the sacrificial core, is at risk of deforming (due, e.g., to residual stress resulting from coefficient of thermal expansion mismatch and shrinkage imbalance during the build curing and copper aging process). A flattening device (using. e.g., mechanical and/or vacuum forces, as described below) can prevent warping/deformation of the "top" surface, or alternatively flatten the "top" surface again following warpage/deformation. Presenting a substantially coplanar surface to a die to which the semiconductor package is to be attached may improve the connection between the semiconductor package and the die during a thermal compression bonding process.

Additionally, some embodiments may include building first vias from a first side of the semiconductor package, and second vias from a second side of the semiconductor package. Further, at least some of the described embodiments provide significant design and substrate manufacturing flexibility. In at least one embodiment, infringement may be detected by taking a cross-section of a coreless device with embedded components, which may show, for example, a first set of vias inverted relative to a second set of vias. In at least one embodiment, the cross-section may show a narrower side of a first set of vias facing a "top" of the device and a narrower side of a second set of vias facing a "bottom" of the device.

FIG. 1 illustrates a side, cross-sectional view of an integrated circuit assembly 100, in accordance with various embodiments. The integrated circuit assembly 100 may include a semiconductor package 102 and a die 104. In at least one embodiment, the integrated circuit assembly 100 may include multiple dies 104 coupled to the semiconductor package 102. The semiconductor package 102 may include an embedded interconnect 106 (e.g. a bridge interconnect, an active die, or a passive die). In the illustrated embodiment, the semiconductor package 102 includes two embedded bridge interconnects 106, but in other embodiments, the semiconductor package 102 may include any number of embedded interconnects 106.

The semiconductor package 102 may include a semiconductor package first side 108 and a semiconductor package second side 110, opposite the semiconductor package first side 108. The semiconductor package 102 may include first vias 112. Each first via 112 may include a first end 114 that is narrower than a second end 116 of the first via 112. In some embodiments, a distance between the first end 114 (the narrower end) of the first via 112 and the semiconductor package first side 108 may be less than a distance between the second end 116 (the wider end) of the first via 112 and the semiconductor package first side 108. For example, in the illustrated embodiment, the narrower end (first end 114) of the first via 112 is facing "up," while the wider end (second end 116) of the first via 112 is facing "down."

The semiconductor package 102 may further include second vias 118. Each second via 118 may include a first end 120 that is narrower than a second end 122 of the second via 118. In some embodiments, a distance between the second end 122 (the wider end) of the second via 118 and the semiconductor package first side 108 may be less than a distance between the first end 120 (the narrower end) of the second via 118 and the semiconductor package first side 108. For example, in the illustrated embodiment, the wider end (second end 122) of the second via 118 is facing "up," while the narrower end (first end 120) of the second via 118 is facing "down." In some embodiments, the first vias 112 and second vias 114 may comprise copper.

The integrated circuit assembly 100 may further include an electrolytic connector 124 that electrically couples the semiconductor package 102 to the die 104. In the illustrated embodiment, the electrolytic connector 124 includes a copper pillar 126 and a solder bump 128. In at least one embodiment, the die 104 is electrically coupled to the embedded bridge interconnect 106 via the second via 118 and the electrolytic connector. In at least one embodiment, at least a portion of the semiconductor package first side 108 has a profile complementary to a profile of a surface of a sacrificial core.

Figure 2:
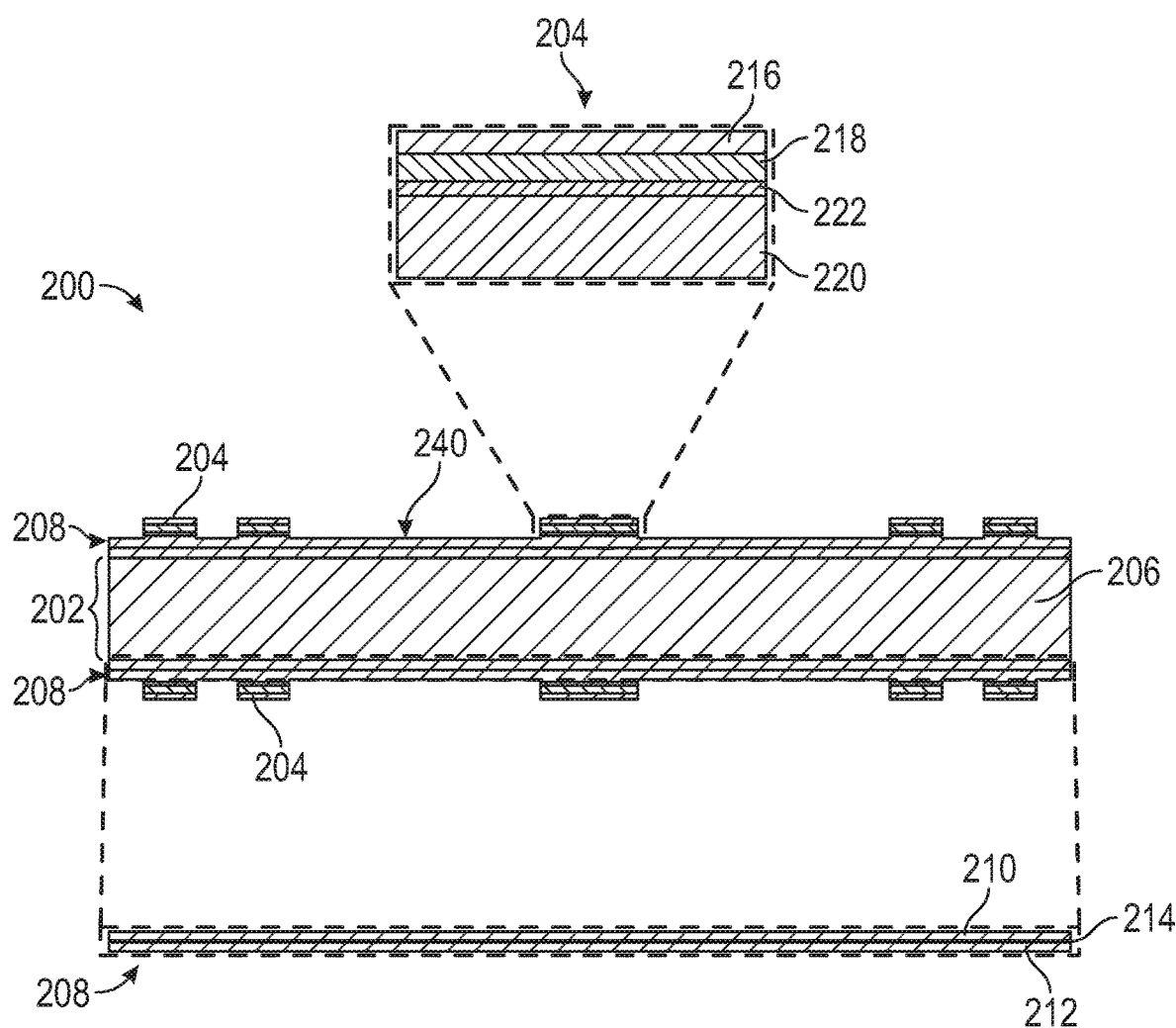
FIGS. 2-19 illustrate side, cross-sectional views of an assembly subsequent to various operations in the manufacture of an integrated circuit assembly, in accordance with various embodiments.

FIGS. 2-19 illustrate side, cross-sectional views of an assembly subsequent to various operations in the manufacture of a semiconductor package (such as the semiconductor package 102) and an integrated circuit assembly (such as the integrated circuit assembly 100), in accordance with various embodiments. FIG. 2 illustrates an assembly 200, which may include a sacrificial core 202 and metal plating 204 formed on the sacrificial core 202. The sacrificial core 202 may include a body material 206 disposed between foils 208. In some embodiments, the foil 208 may include an inner foil layer 210, an outer foil layer 212, and an adhesive layer 214 disposed between the inner foil layer 210 and the outer foil layer 212. In at least one embodiment, the inner foil layer 210 and the outer foil layer 212 may comprise a copper foil. The adhesive layer 214 may temporarily bond the inner foil layer 210 to the outer foil layer 212. In at least one embodiment, the adhesive layer 214 may act as a release layer, such that the inner foil layer 210 and the outer foil layer 212 may be "peeled" apart. When the outer foil layer 212 is peeled away from the inner foil layer 210, the sacrificial core 202 may be released, or "sacrificed." In at least one embodiment, the sacrificial core 202 may comprise a peelable sacrificial core 202. In the illustrated embodiment, the assembly 200 includes two foils 208 disposed at opposite sides of the body material 206. While the illustrated embodiments are described with regard to a sacrificial core 202, in some embodiments, other components may be used in place of the sacrificial core 202, for example, a reusable carrier (e.g., stainless steel with a mechanical release layer) or a glass carrier (e.g., with laser or mechanical release layers). In at least one embodiment a laser release approach, the build-up may be deposited on only one side of the panel. In at least one embodiment, a layer of electroless copper or sputtered Ti or Cr or Ni and Cu seed layer may be deposited followed by electrolytic plating using the deposited seed layer to form a thicker Copper layer.

In at least one embodiment, the metal plating 204 may be formed on the outer foil layer 212. In at least one embodiment, the metal plating 204 may be formed on a surface 240 of the sacrificial core 202. The metal plating 204 may include a first layer 216 and a second layer 218, wherein the first layer 216 is formed on the second layer 218. In at least one embodiment, the first layer may comprise copper. In at least one embodiment, the second layer 218 may comprise nickel. In some embodiments, the metal plating 204 may include a third layer 220, wherein the second layer 218 is formed on the third layer 220, and the first layer 216 is formed on the second layer 218. In at least one embodiment, the third layer 220 may comprise copper. In some embodiments, the metal plating 204 may include a fourth layer 222, wherein the fourth layer 222 is formed on the third layer 220, the second layer 218 is formed on the fourth layer 222, and the first layer 216 is formed on the second layer 218. In at least one embodiment, the third layer 220 may comprise copper, and the fourth layer 222 may comprise gold. In the illustrated embodiment, the metal platings 204 formed on each outer foil layer 212 are formed as mirror images, such that two identical semiconductor packages can be manufactured on the same sacrificial core 202. For ease of illustration, not all instances of various structures will be labeled, but instead a representative feature will be labeled to represent like features.

Figure 3:
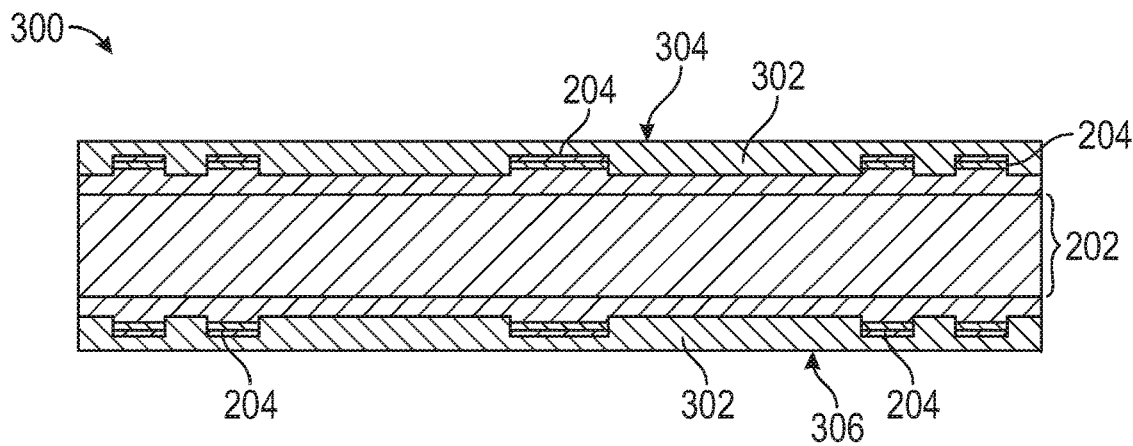

FIG. 3 illustrates an assembly 300 subsequent to providing build-up material 302 deposited at a first side 304 and a second side 306 of the assembly 300. In at least one embodiment, the build-up material 302 may be deposited directly on the sacrificial core 202. In some embodiments, the build-up material 302 comprises a first build-up layer. In some embodiments, the build-up material 302 covers the metal plating 204.

Figure 4:
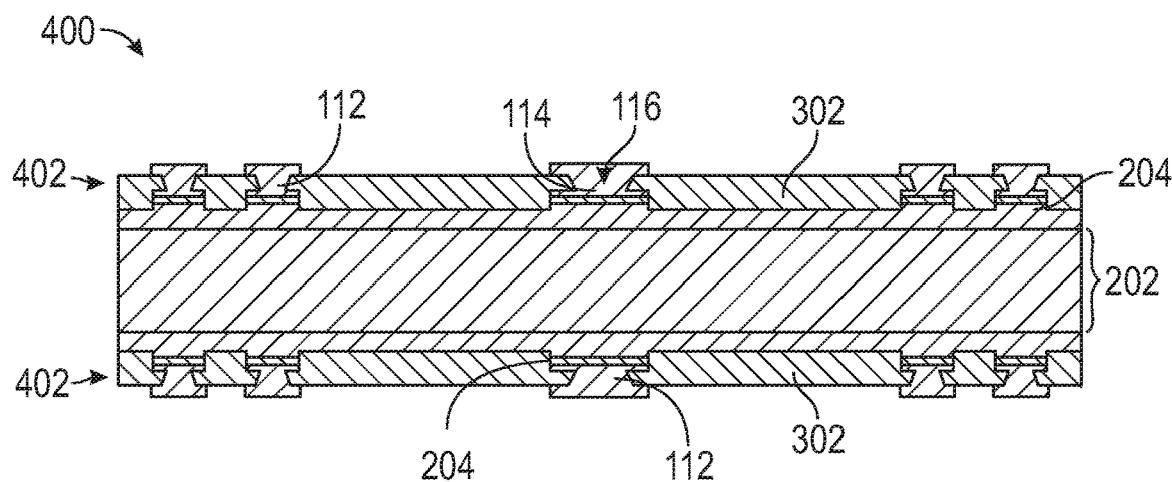

FIG. 4 illustrates an assembly 400 subsequent to forming a first set 402 of first vias 112 through the build-up material 302. The first vias 112 may include the first end 114 narrower than the second end 116. In at least one embodiment, one or more of the first vias 112 may be formed on the metal plating 204. In at least one embodiment, one or more of the first vias 112, of the first set 402, comprise microvias. The assembly 400 may be formed from the assembly 300 using, for example, a microvia fabrication technique, a dry film resist technique, a patterned plating technique, a combination of these, or the like.

Figure 5:
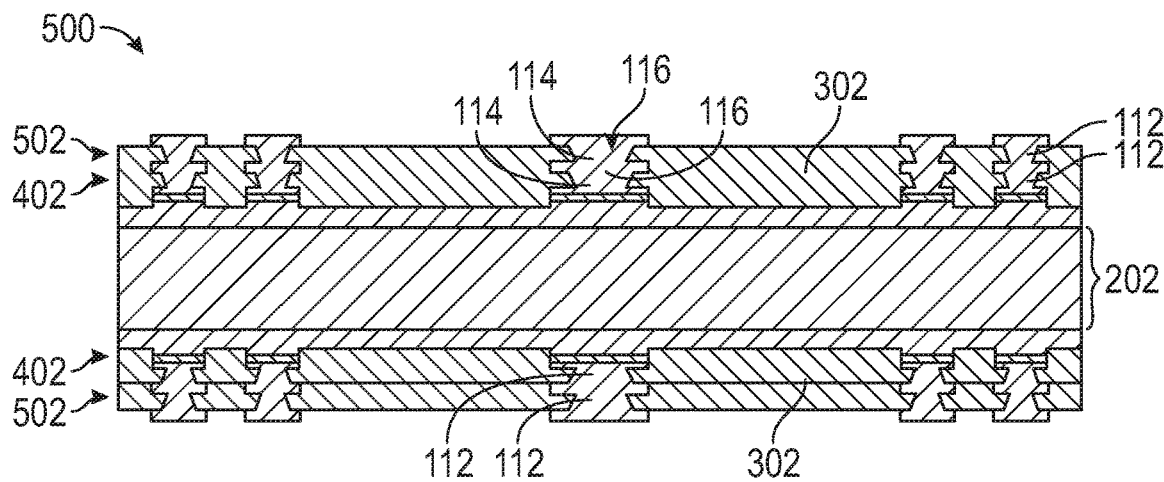

FIG. 5 illustrates an assembly 500 subsequent to providing additional build-up material 302 and forming a second set 502 of first vias 112 through the additional build-up material 302. The first vias 112 may include the first end 114 narrower than the second end 116. In at least one embodiment one or more of the second set 502 of the first vias 112 may be formed on the first set 402 of the first vias. In some embodiments, the first end 114 (the narrower end) of the second set 502 of the first vias 112 is coupled to the second end 116 (the wider end) of the first set 402 of the first vias 112. In at least one embodiment, one or more of the first vias 112, of the second set 502, comprise microvias. The assembly 500 may be formed from the assembly 400 using, for example, a microvia fabrication technique, a dry film resist technique, a patterned plating technique, a combination of these, or the like.

Figure 6:
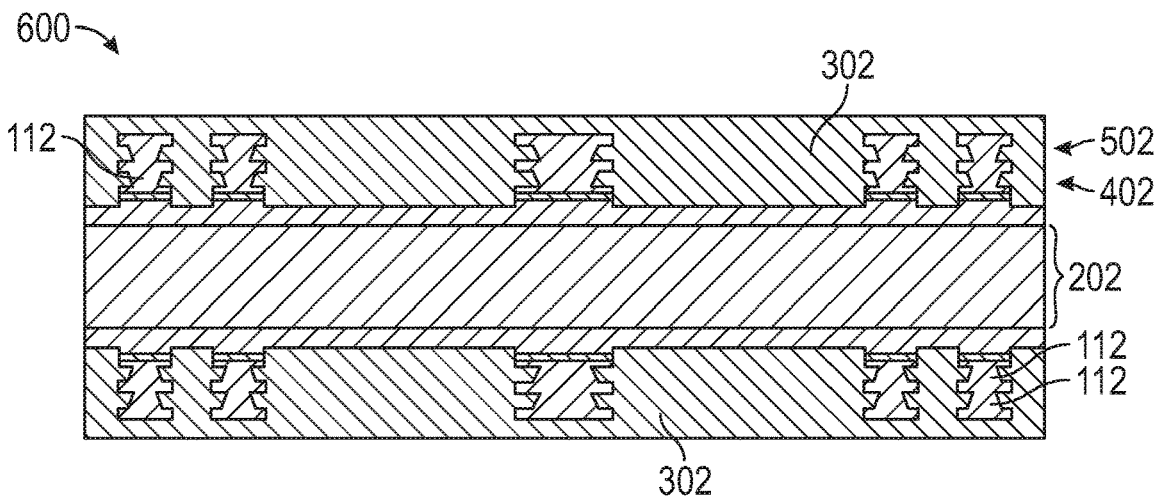
Figure 7:
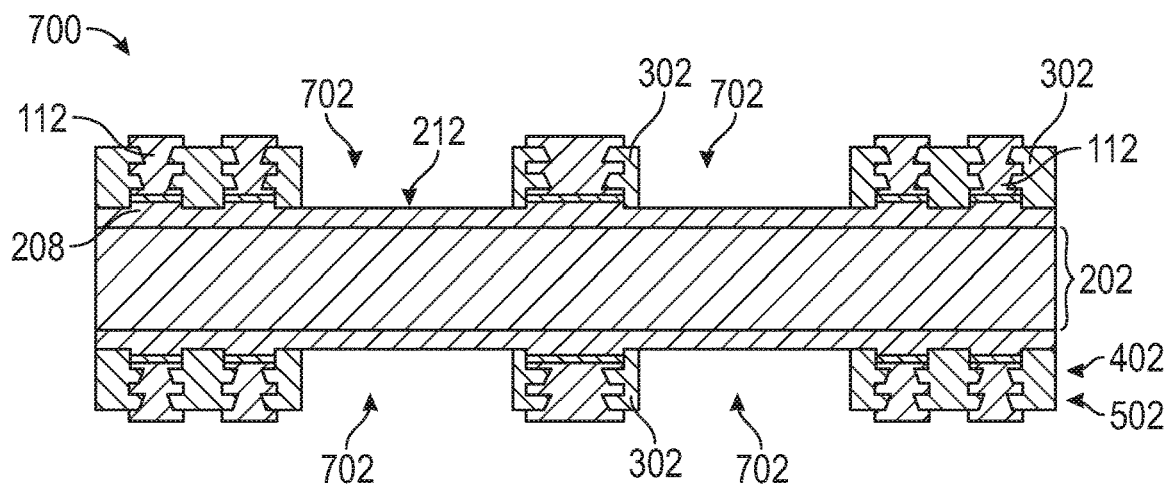

FIG. 6 illustrates an assembly 600 subsequent to providing additional build-up material 302 over the second set 502 of first vias 112. FIG. 7 illustrates an assembly 700 subsequent to forming cavities 702 in the build-up material 302. In at least one embodiment, the cavity 702 is formed down to the outer foil level 212 of the foil 208 of the sacrificial core 202. While the illustrated embodiment includes first and second sets 402, 502 of first vias 112, other embodiments may include a different number of sets of first vias 112, and a different number of build-up material 302 layers. The cavity 702 may be formed by a laser post finishing all of the build-up layers (as shown in FIG. 7) through laser ablation or a photolithographic process using a photo imagible dielectric material. In at least one embodiment, the cavity 702 may be created at each layer. In at least one embodiment, the cavity 702 may be created using ga dry etch process with the aid of a mask.

Figure 8:
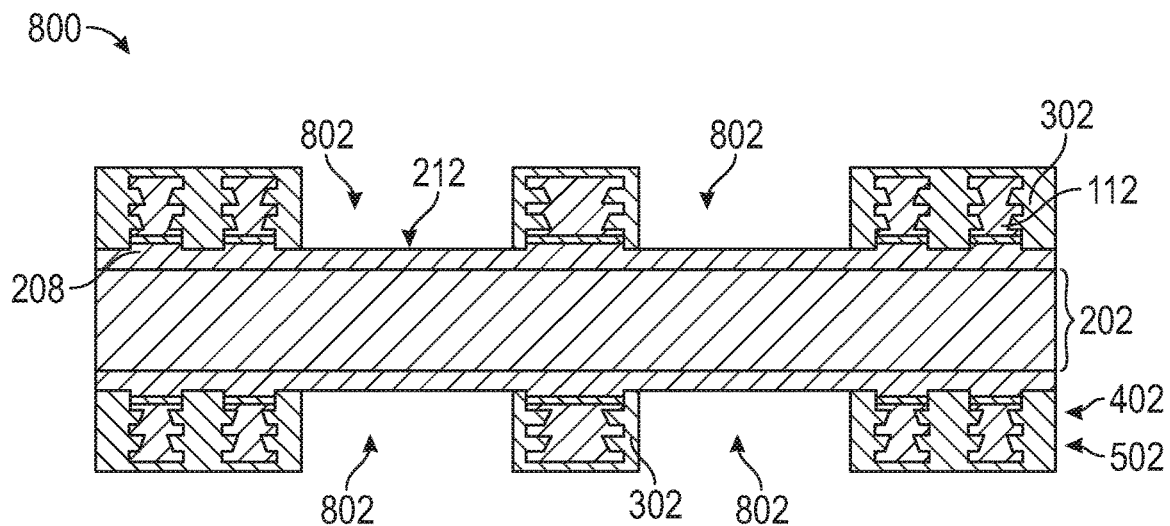

FIG. 8 illustrates an alternative assembly 800 to the assembly 700 of FIG. 7. FIG. 8 illustrates the assembly 800 subsequent to providing an additional layer of build-up material 302 over the second set 502 of first vias 112, as well as forming cavities 802 through the build-up material, and between the various first vias 112.

Figure 9:
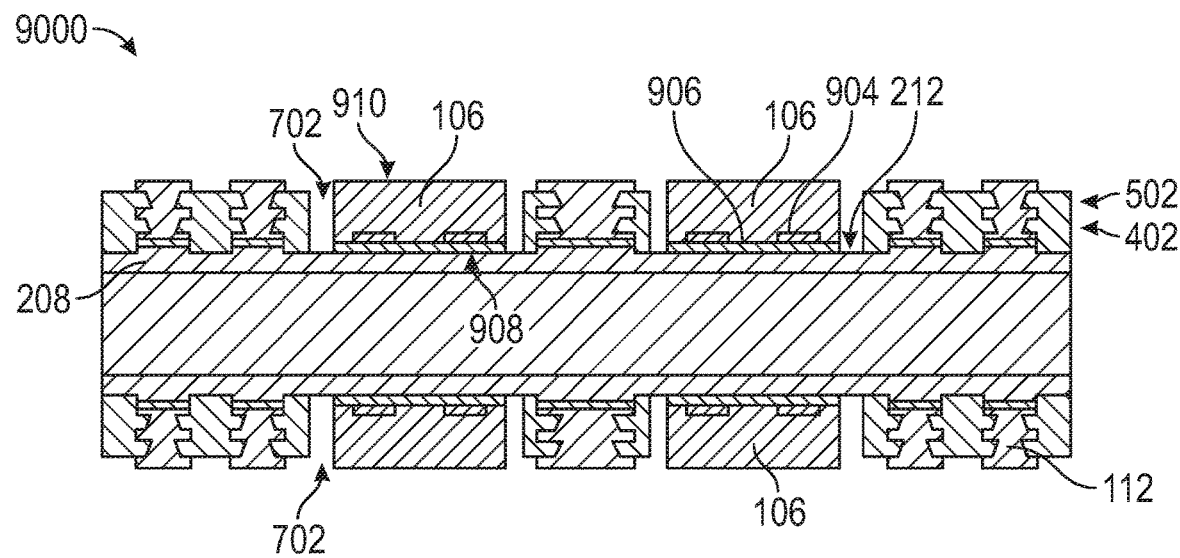

FIG. 9 illustrates an assembly 900 formed from the assembly 700 subsequent to disposing bridge (or passive or active die) interconnects 902 in the cavities 702. In some embodiments, the bridge interconnect 106 may include one or more conductive pads 904 disposed on a die backside film 906 at a bridge interconnect first side 908 of the bridge interconnect 106. The bridge interconnect first side 908 may contact the outer foil layer 212 of the foil 208. The bridge interconnect may include a bridge interconnect second side 910 opposite the bridge interconnect first side 908. While the illustrated embodiment includes four bridge interconnects 902, other embodiments may include any number of bridge interconnects 902.

Figure 10:
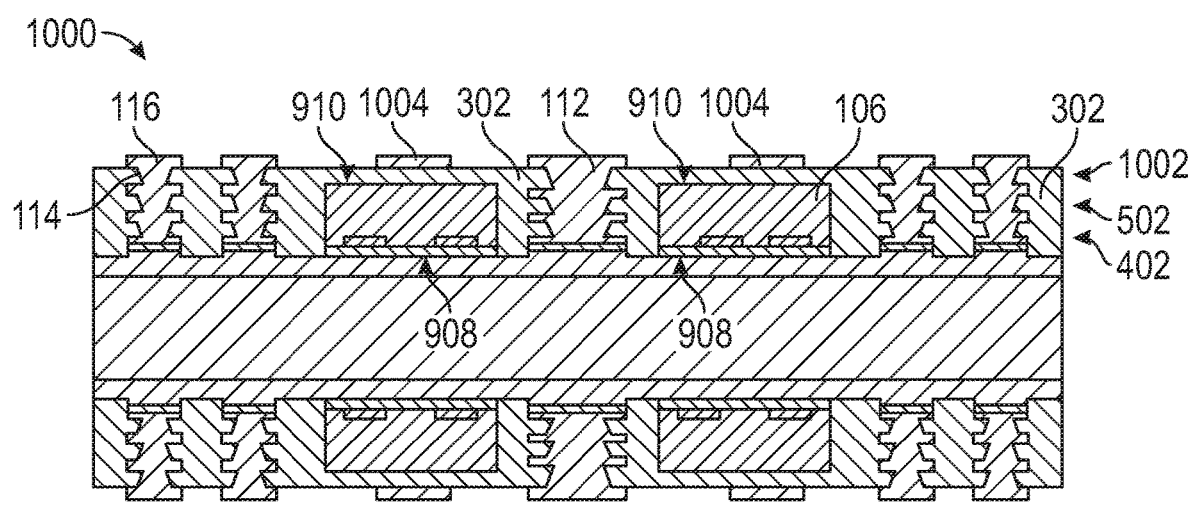

FIG. 10 illustrates an assembly 1000 subsequent to providing additional build-up material 302 to embed the bridge interconnect 106, forming a third set 1002 of first vias 112, and providing additional build-up material 302 over the third set 1102 of first vias 112. Each via 112 of the third set 1002 of first vias 112 may include a first end 114 that is narrower than a second end 116. In at least one embodiment, the first end 114 (the narrower end) of the first via 112 of the third set 1002 is connected to the second end 116 (the wider end) of the first via 114 of the second set 502. The assembly 1000 may also include a conductive structure 1004 on the build-up material 302 formed over the bridge interconnect second side 910. The assembly 1000 may be formed from the assembly 900 using, for example, a microvia fabrication technique, a dry film resist technique, a patterned plating technique, a combination of these, or the like.

Figure 11:
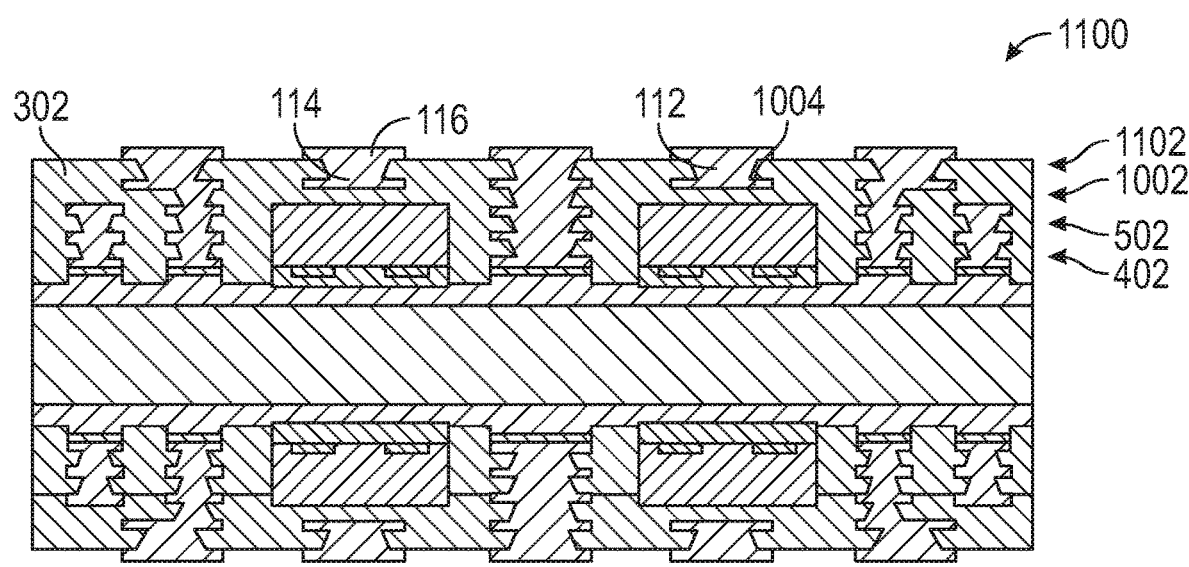

FIG. 11 illustrates an assembly 1100 subsequent to providing additional build-up material 302 over the conductive structure 1004, and forming a fourth set 1102 of first vias 112. Each first via 112 of the fourth set 1102 may include a first end 114 and a second end 116. One or more vias of the fourth set 1102 of first vias 112 may be connected at its first end 114 (the narrower end) to the second end 116 (the wider end) of a via of the third set 1002 of first vias 112. One or more vias of the fourth set 1102 of first vias 112 may be connected at its first end 114 (the narrower end) to a conductive structure 1004. In at least one embodiment, the assembly 900 may include a via 112 extending between the embedded interconnect 910 and the conductive structure 1004.

Figure 12:
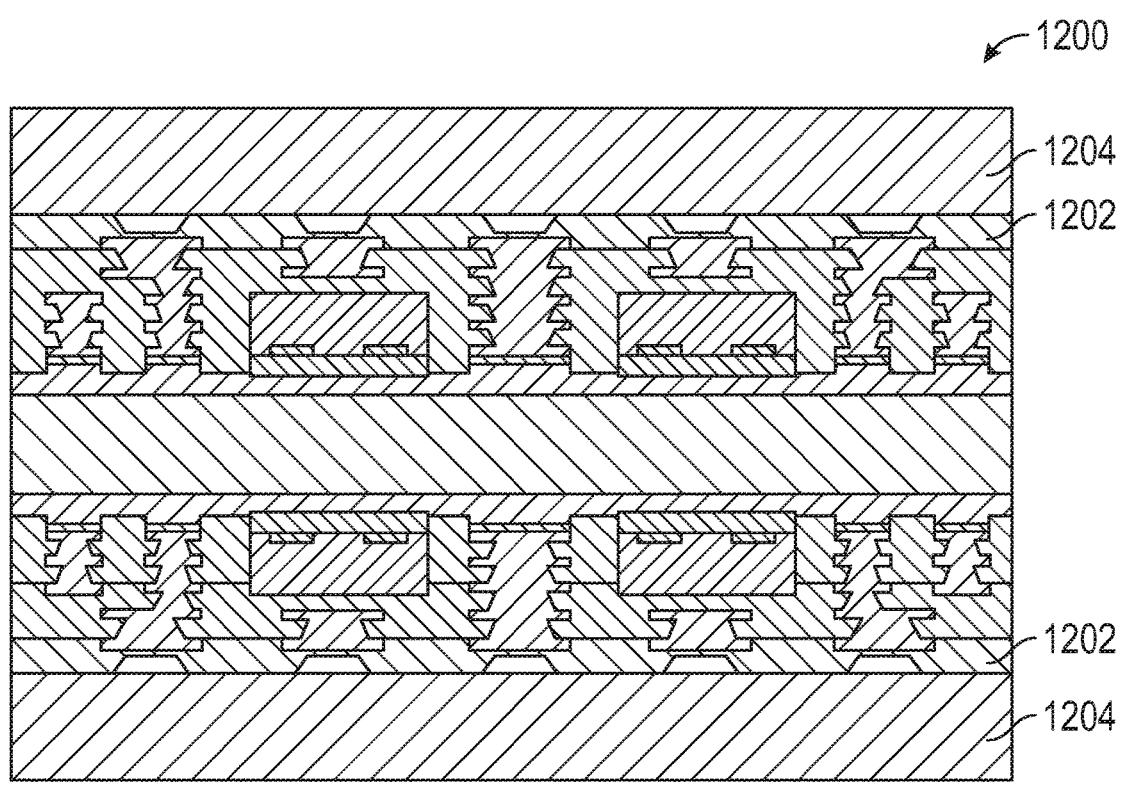

FIG. 12 illustrates an assembly 1200 subsequent to providing a patterned solder resist 1202 to the assembly 1100 of FIG. 11, and subsequent to providing a flattening device 1204 over the patterned solder resist 1202. In some embodiments, the flattening device 1204 may be a temporary carrier. In at least one embodiment, the flattening device 1204 may a peelable sacrificial core. In at least one embodiment, the flattening device 1204 may be a glass carrier. In some embodiments, the flattening device 1204 may be provided in case the panel handling is challenging for the consecutive processes post depaneling. In at least one embodiment, the flattening device 1204 may prevent warping or deformation of the substrate due to residual stress built up in the substrate due to coefficient of thermal expansion mismatch between build-up and copper layers, and shrinkage imbalance during build curing and copper aging processes.

Figure 13:
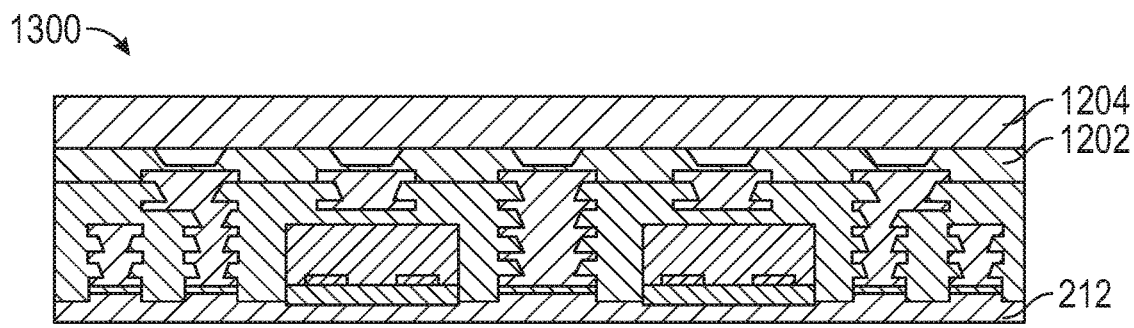

FIG. 13 illustrates an assembly 1300 subsequent to "peeling" away or otherwise removing the body material 206 of the sacrificial core 202 from the assembly 1200. In at least one embodiment, the assembly 1300 may be formed from the assembly 1200 using depaneling techniques. In at least one embodiment, the depaneling process results in two assemblies, each of the mirror image formations built on the outer foil layer 212. For ease of illustration, the rest of the figures will only illustrate one of the resulting assemblies, but each of the manufacturing operations may be performed on each of the two assemblies in parallel, in series, or in any desired order. In at least one embodiment, the flattening device 1204 maintains the shape of the assembly 1300, preventing warping or deforming that would otherwise occur.

Figure 14:
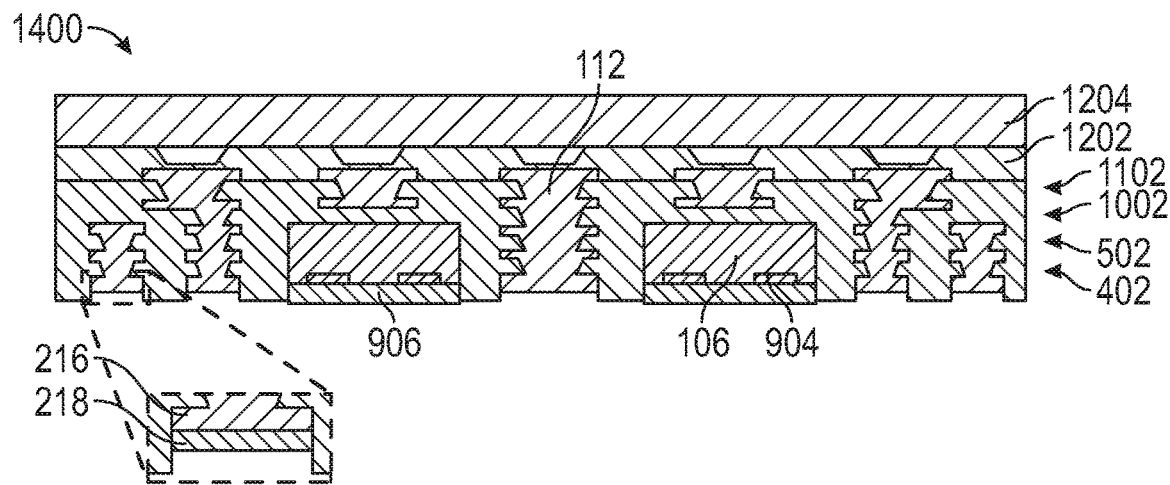

FIG. 14 illustrates an assembly 1400 subsequent to etching away the outer foil layer 212 from the assembly 1300 of FIG. 13. The second layer 218 of the metal plating 204 may also be removed. The fourth layer 222 (FIG. 2) of the metal plating 204 may also be removed. In at least one embodiment, the second layer 218 may serve as an etch stop, for example if the outer foil layer comprises copper, and the second layer 218 comprises nickel, a copper etching process will remove all of the copper and stop at the nickel. If desired, in some embodiments, a subsequent nickel etching process can be used to remove the second layer 218. In at least one embodiment, the die backside film 906 may prevent the conductive pads 904 from being etched during the etching process.

Figure 15:
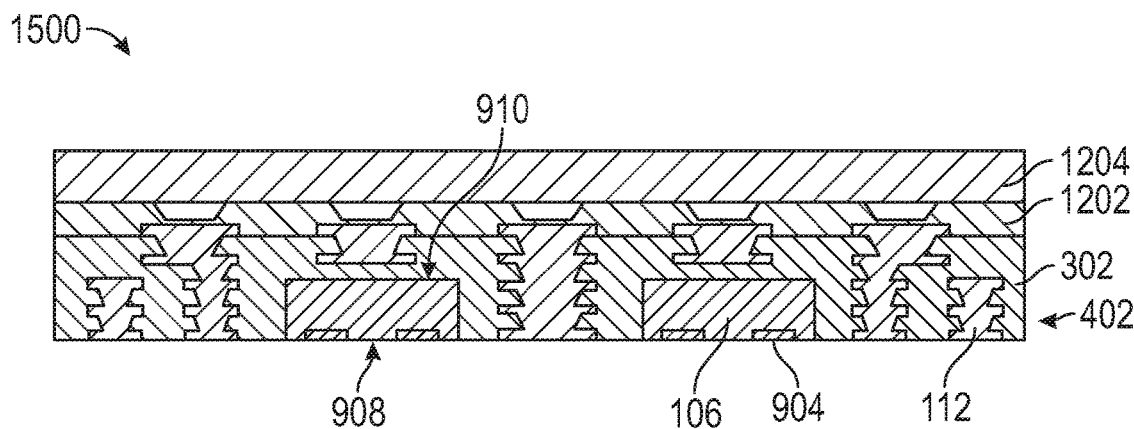

FIG. 15 illustrates an assembly 1500 subsequent to removing the die backside film 906 from the bridge interconnects 902, and subsequent to removing the build-up material 302 (e.g., using grinding or plasma etching) between the first set 402 of first vias 112, such that the build-up material 302 is even with the first set 402 of first vias. In at least one embodiment, the conductive pads 904 may now be exposed at the bridge interconnect first side 908.

Figure 16:
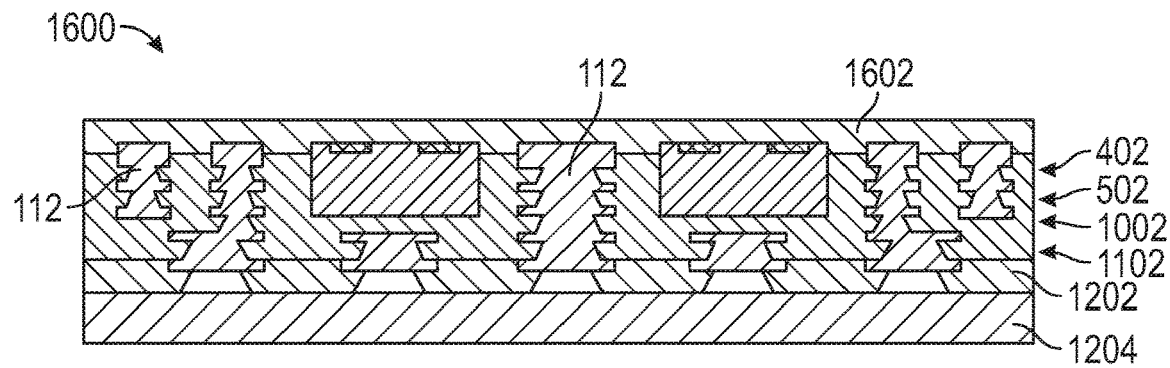

FIG. 16 illustrates an assembly 1600 subsequent to flipping the assembly 1500 over, such that build-up can begin on the bridge interconnect first side 908, and subsequent to providing a second build-up material 1602 over the bridge interconnect first side 908. In the flipped configuration of the illustrated embodiment, the flattening device 1204 appears on "bottom" followed by the patterned solder resist 1202, the fourth set 1102 of first vias, the third set 1002 of first vias, the second set of first vias 502, and finally the first set 402 of first vias 112, with the second build-up material on "top." In at least one embodiment, the second build-up material 1602 may comprise the same material as the previous build-up material 302. In at least one embodiment, the second build-up material 1602 and the build-up material 302 may comprise different materials. In at least one embodiment, the second build-up material 1602 may comprise a build-up laminate layer.

Figure 17:
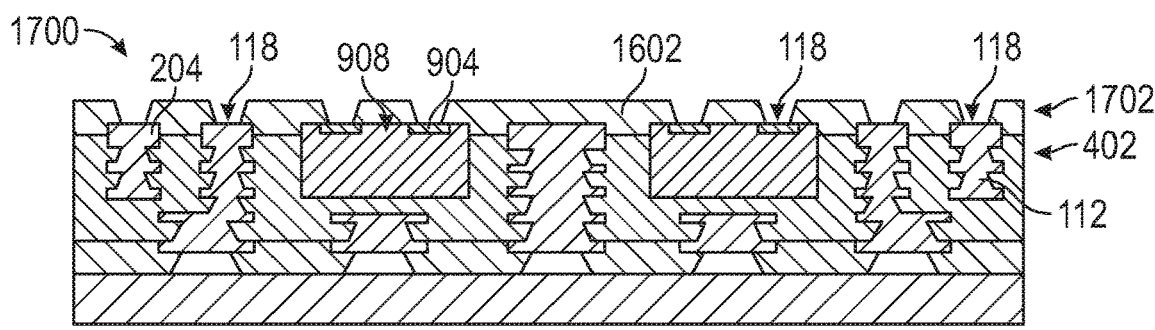
Figure 18:
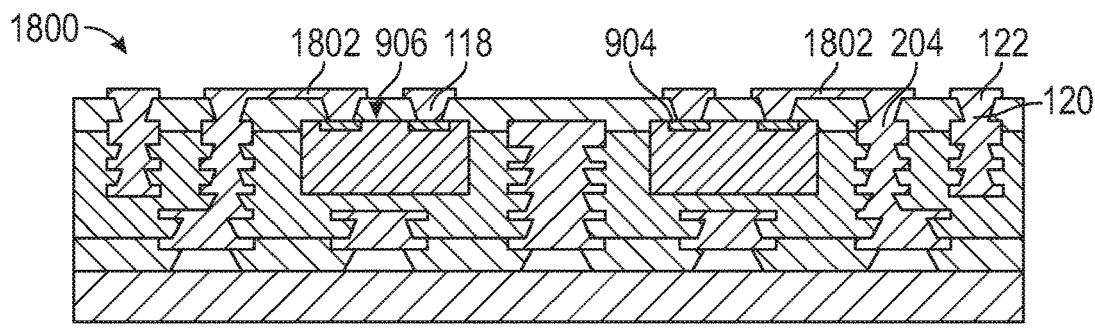

FIG. 17 illustrates an assembly 1700 subsequent to forming a first set 1702 of second vias 118 through the second build-up material 1602 and FIG. 18 illustrates an assembly 1800 subsequent to filling the first set 1702 of second vias 118 and forming pattern plating 1802. In Some embodiments, each of the second vias 118 include a first end 120 that is narrower than a second end 122. In some embodiments, the first end 120 of a second via 118 may contact a conductive pad 904 at the bridge interconnect first side 908. In some embodiments, the first end 120 of a second via 118 may contact a metal plating 204. In at least one embodiment the pattern plating 1802 may connect two of the first set 1702 of second vias 118 together.

Figure 19:
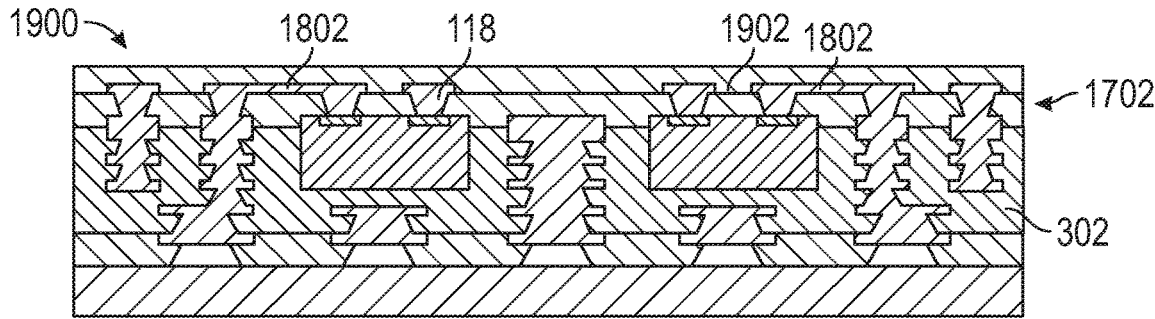

FIG. 19 illustrates an assembly 1900 subsequent to providing additional build-up material 1902 over the first set 1702 of second vias 118 and the pattern plating 1802. In at least one embodiment, the additional build-up material 1902 comprises solder lamination. In some embodiments the additional build-up material may be the same as previous build-up material 302.

Figure 20A:
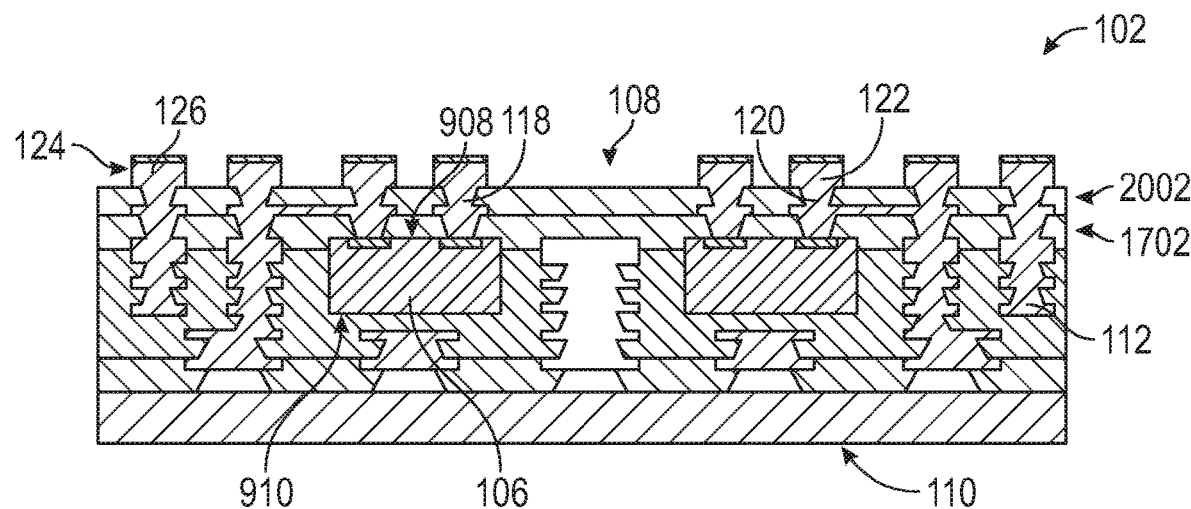
FIGS. 20A and 20B illustrate side, cross-sectional views of a semiconductor package including an electrolytic connector, in accordance with various embodiments.
Figure 20B:
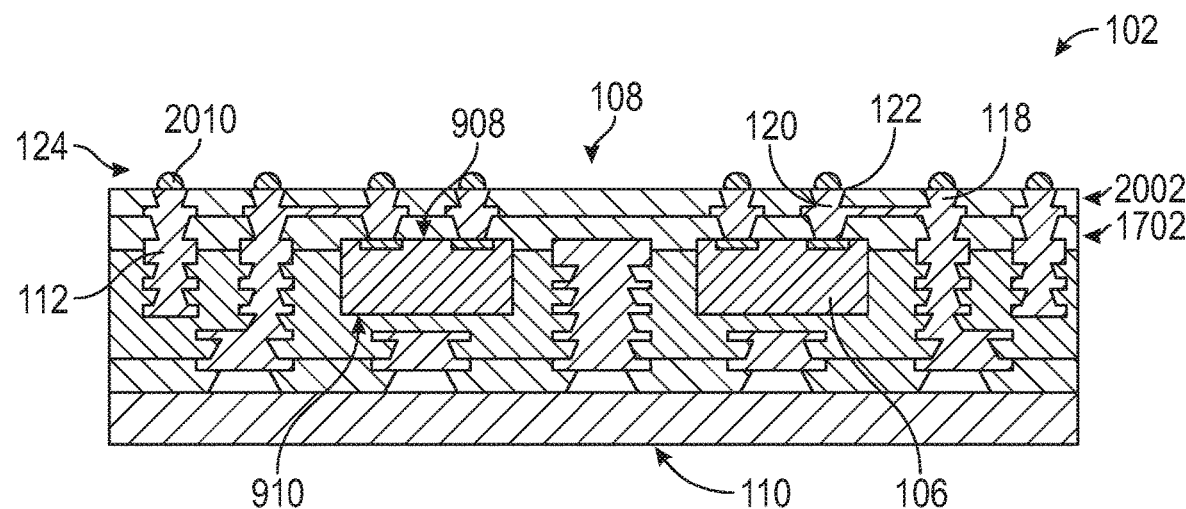

Each of FIGS. 20A and 20B illustrate a semiconductor package 102, subsequent to forming and filling a second set 2002 of second vias 118 in the additional build-up material 1902. Each of the second vias 118 of the second set may include a first end 120 that is narrower than a second end 122. In at least one embodiment, the first end 120 (the narrower end) of a second via 112 of the second set 2002 may be in contact with the second end 122 (the wider end) of a second via 112 of the first set 1702. The semiconductor package 102 may include a semiconductor package first side 108 and a semiconductor package second side 110 opposite the semiconductor package first side 108. In the illustrated embodiments of FIGS. 20A and 20B, the semiconductor package first side 108 appears as the "top" side and the semiconductor package second side 110 appears as the "bottom" side.

The embedded bridge interconnect 106 may be positioned within the semiconductor package 102, such that a distance between the bridge interconnect first side 908 and the semiconductor package first side 108 is less than a distance between the bridge interconnect second side 910 and the semiconductor package first side 108. Each of the first vias 112 may be positioned within the semiconductor package 102, such that a distance between the first end 114 of the first via 112 and the semiconductor package first side 108 is less than a distance between the second end 114 of the first via 112 and the semiconductor package first side 108. Each of the second vias 118 may be positioned within the semiconductor package 102, such that a distance between the second end 122 of the second via 118 and the semiconductor package first side 108 is less than a distance between the first end 120 of the second via 118 and the semiconductor package first side 108. For example, in the case of the illustrated embodiments of FIGS. 20A and 20B, the first side 114 (the narrower side) of the first vias 112 face toward the semiconductor package first side 108 (the "top"), while the first side 120 (the narrower side) of the second vias 118 face toward the semiconductor package second side 110 (the "bottom"). In at least one embodiment, the second vias 118 may allow for increased design flexibility.

The semiconductor package 102, may further include one or more electrolytic connectors 124 disposed at the semiconductor package first side 108. In some embodiments, the electrolytic connector 124 may comprise a copper pillar 126. The copper pillar 126 may be bonded to the die 104 via a solder bump 128. In at least one embodiment, the electrolytic connector 124 may comprise the copper pillar 126 and the solder bump 128. In some embodiments, the electrolytic connector 124 may comprise a solder bump 2010 disposed directly on the second vias 118. In at least one embodiment, the electrolytic connector 124 may comprise plated solder. After the semiconductor package 102 has been electrically coupled to the die 104, the flattening device 1204 may be removed (e.g., peeled off, or otherwise removed) to transform the semiconductor package 102 of FIGS. 20A and 20B to the integrated circuit assembly 100 of FIG. 1.

Figure 21:
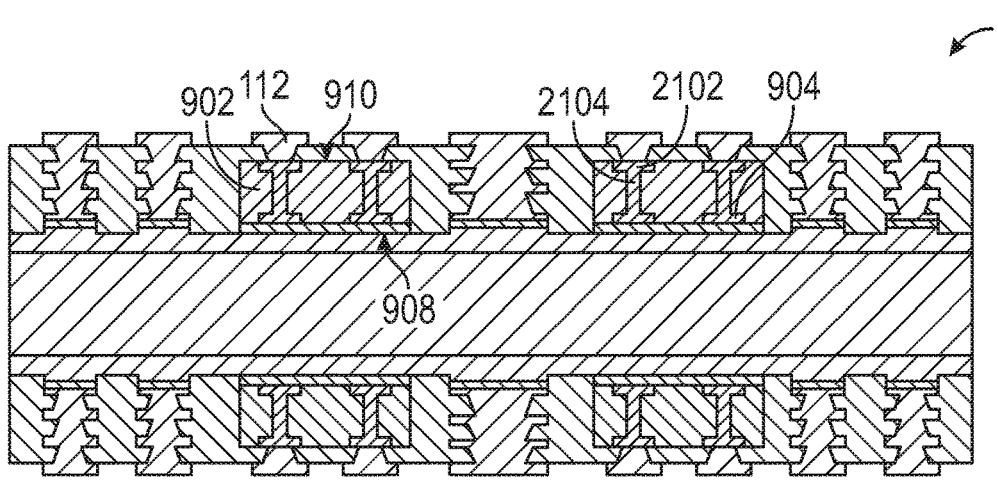
FIG. 21 illustrates a side, cross-sectional view of an active bridge interconnect, in accordance with various embodiments.

FIG. 21 illustrates an assembly 2100, at a similar stage in the manufacturing process as assembly 1000 of FIG. 10, in that the assembly 2100 is shown subsequent to embedding the bridge interconnect 106. However, in the illustrated embodiment, the bridge interconnect 106 may include one or more conductive pads 2102 formed at the bridge interconnect second side 910 in addition to the one or more conductive pads 904 formed at the bridge interconnect first side 908. The bridge interconnect 106 may further include a third via 2104 to electrically couple a conductive pad 904 on the bridge interconnect first side 908 to a conductive pad 2102 on the bridge interconnect second side 910. In some embodiments, the third via 2104 may comprise a through-silicon via. In at least one embodiment, the through-silicon via 2104 may allow for the bridge interconnect 106 to comprise an active bridge interconnect. In at least one embodiment, the through-silicon vias 2104 may allow the bridge connect 902 to receive power from the semiconductor package first side 108 by electrically coupling a power supply to the electrolytic connector 124. In at least one embodiment, the die 104 may comprise the power supply. In some embodiments, the through-silicon vias allow for increased design flexibility.

Figure 22A:
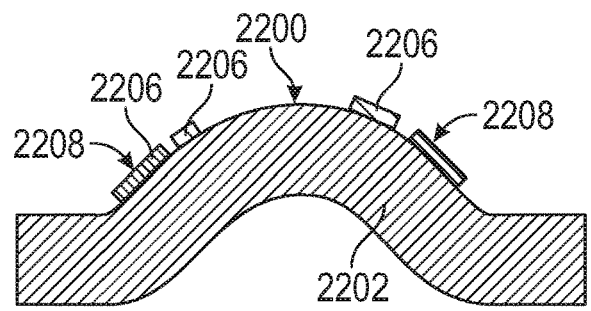
FIGS. 22A and 22B illustrate side, cross-sectional views of a semiconductor package before and after flattening a distorted surface, in accordance with various embodiments.
Figure 22B:
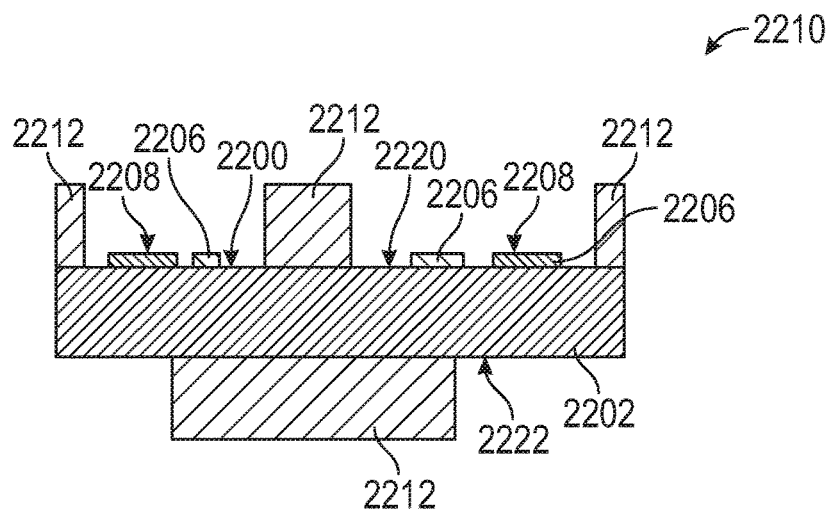

FIGS. 22A and 22B illustrate side, cross-sectional views of a semiconductor package before and after flattening a distorted surface 2200 of a semiconductor package 2202, which may have components 2206 disposed thereon. In at least one embodiment, the components 2206 may include electrolytic connectors, contacts, pads, a combination of these, or the like. In some embodiments, the components 2206 may have been formed on the surface 2200 so that the surface 2208 of each component 2206 is planar when the surface 2200 is flat, but distortion of the semiconductor package 2202 may cause the component surface 2208 to go out of plane. FIG. 22B shows the surface 2200 after it has been "flattened" with a flattening device 2210. In at least one embodiment, the flattening device 2210 is deployed preemptively to prevent the surface 2200 from ever deforming as in FIG. 22A. In at least one embodiment, the flattening device 2210 may comprise a temporary carrier. In some embodiments, the flattening device 2210 may comprise a sacrificial core or a glass carrier. In at least one embodiment, the flattening device 2210 may comprise a vacuum jig. In at least one embodiment, the flattening device 2210 may comprise multiple flattening device components 2212. The multiple flattening device components may be positionable in different positions relative to the semiconductor package 2202 in various embodiments.

In at least one embodiment, the flattening device may comprise a vacuum jig 2210 including multiple vacuum jig components 2212. In at least one embodiment, a first vacuum jig component 2212 may be attached to the semiconductor package first side 2220 to pull the surface 2200 flat, then a second jig component 2212 may be attached to the semiconductor package second side 2222, to hold the semiconductor package 2202 in the flat position. Prior to attaching the die to the semiconductor package first side 2220, the first vacuum jig component 2212 may be removed from the semiconductor package first side 2220 while the second vacuum jig component 2212 holds the semiconductor package 2202 flat from the semiconductor package second side 2222. In at least one embodiment, the vacuum jig 2210 may be used preemptively to prevent the semiconductor package 2202 from deforming or distorting.

Figure 23:
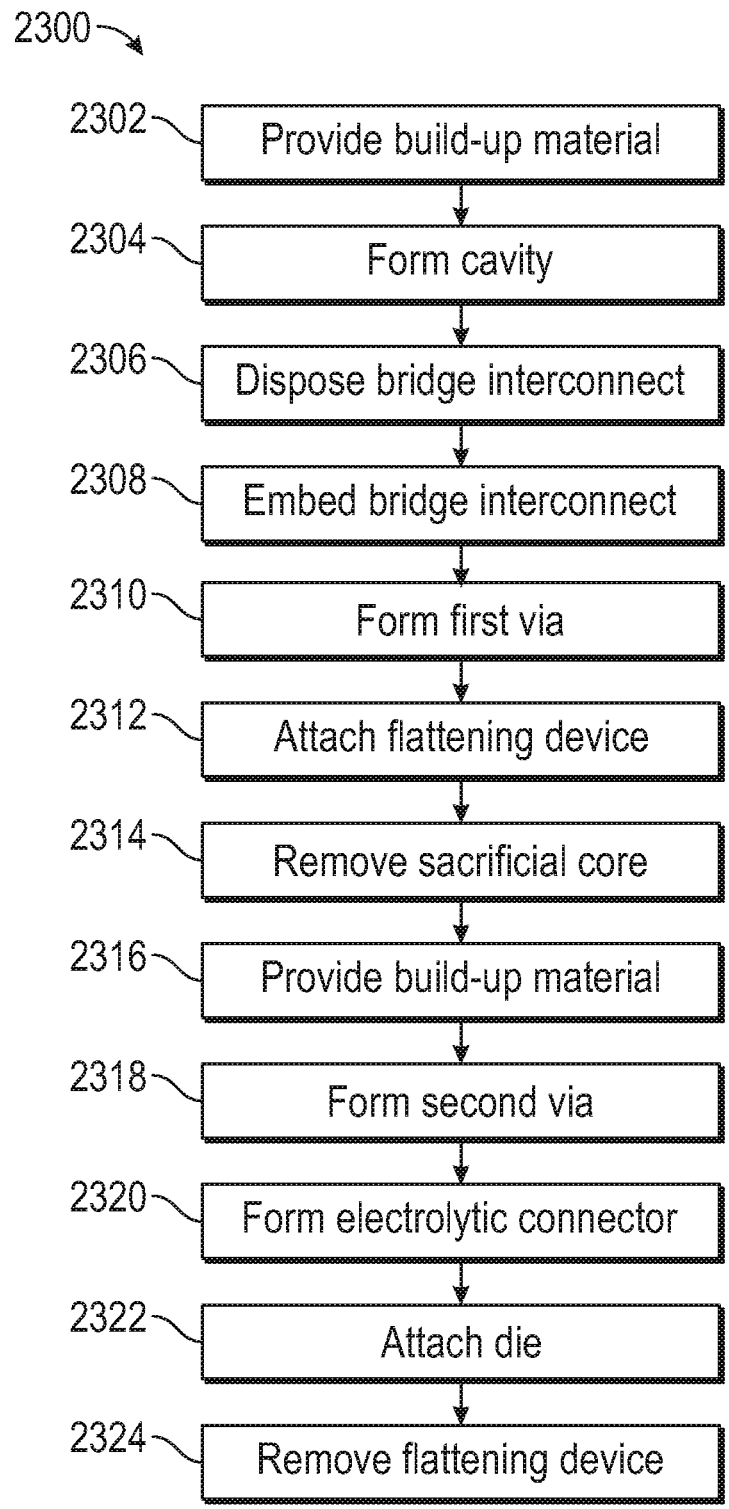
FIG. 23 is a flow diagram of a method for manufacturing an integrated circuit assembly in accordance with various embodiments.

FIG. 23 is a flow diagram of a method 2300 for manufacturing an integrated circuit assembly, for example, the integrated circuit assembly 100 of FIG. 1, in accordance with various embodiments. The method 2300 will be describe with reference to the features of FIGS. 1-22.

At block 2302, build-up material 302 may be provided on a sacrificial core 202. In at least one embodiment, the build-up material 302 may be formed on a surface 240 of the sacrificial core 202, for example the surface 240 of the outer foil layer 212.

At block 2304, a cavity 802 may be formed in the build-up material 302. In at least embodiment, the cavity 802 may be sized and shaped to receive the bridge interconnect 106. The cavity 802 may be formed using any of a variety of methods, for example, laser, photolithography, wet etching, dry etching, a combination of these, or the like. In at least one embodiment, the cavity 802 may be formed in the build-up material 302 down to the surface 240 of the sacrificial core 202.

At block 2306, the bridge interconnect 106 may be disposed in the cavity 802. In some embodiments the bridge interconnect 106 may be passive with one or more conductive pads 904 at a bridge interconnect first side 908. In at least one embodiment, the bridge interconnect 106 may be active with conductive pads 904 at the bridge interconnect first side 908, conductive pads 2102 at a bridge interconnect second side 2102, and through-silicon vias 2104 connecting the first set of conductive pads 904 to the second set of conductive pads 2102.

At block 2308, the bridge interconnect 106 may be embedded within the assembly 1000. In at least one embodiment, additional build-up material 302 may be deposited over the bridge interconnect 106 to embed the bridge interconnect 106 within the build-up material 302 formed at the surface 240 of the sacrificial core 202. In at least one embodiment, a distance between the bridge interconnect first side 908 and the surface 240 may be less than a distance between the bridge interconnect second side 910 and the surface 240.

At block 2310, a first via 112 may be formed. In at least one embodiment, one or more layers of build-up material 302 and first vias 112 may be formed prior to formation of the cavity 802, such that the cavity 802 may be formed between first vias 112. For example, a first set 402 of first vias 112 may be formed in a first build-up material layer, and a second set 502 of first vias 112 may be formed in a second build-up material layer, prior to formation of the cavity 802. In other embodiments, more or less sets of first vias 112 may be formed prior to the formation of the cavity 802. Following formation of the cavity 802 and embedding of the bridge interconnect 106, further sets of first vias 112 may be formed in build-up material. In at least one embodiment, a third set 1002 and a fourth set 1102 of first vias 112 may be formed following embedding of the bridge interconnect 106. In at least one embodiment, the first via 112 may have a first end 114 that is narrower than a second end 116 of the first via 112. In some embodiments, the first end 114 of the first via 112 is closer to the surface 240 of the sacrificial core 202 that the second end 116 of the first via 112 is to the surface 240 of the sacrificial core 202. In some embodiments, a distance between the first end 114 of the first via 112 and the semiconductor package first side 108 is less than a distance between the second end 116 of the first via 112 and the semiconductor package first side 108. In at least one embodiment, the first end 114 of a first via may contact a second end 116 of a first via 112.

At block 2312, a flattening device 1204, 2210 may be attached to the semiconductor package 102 to hold the semiconductor package first side 108 flat. In at least one embodiment, the flattening device 1204, 2210 may comprise a temporary carrier 1204 attached to a side of the semiconductor package 102 opposite the sacrificial core 202. In at least one embodiment, the temporary carrier 1204 may be attached to the semiconductor package second side 110. In some embodiments, the flattening device may help prevent deformation of the semiconductor package 102. In at least one embodiment, the flattening device may be a second sacrificial core or a glass carrier.

At block 2314, the sacrificial core 202 may be removed, peeled away, or sacrificed. In at least one embodiment, the foil 208 is separated, such that the outer foil layer 212 is pulled away from the inner foil layer 210 at the adhesive layer 214. In some embodiments, the manufacturing steps may be formed on either side of the sacrificial core 202, such that removal of the sacrificial core produces two separate assembly devices. In at least one embodiment, the two separate assembly devices may be identical. For the ease of description, we will only describe the following steps of the method 2300 with regard to one of the assembly devices, although it should be understood that any and all of the method 2300 may be performed on the second assembly device as well.

At block 2316, additional build-up material 1602 may be provided at the bridge interconnect first side 908, and at block 2318, one or more second vias 118 may be formed through the additional build-up material 1602. In at least one embodiment, a first set 1702 of second vias 118 may be formed. In some embodiments, the second via 118 may have a first end 120 that is narrower than a second end 122 of the second via 118. In some embodiments, the first end 114 of the first via 112 and the first end 120 of the second via 118 face opposite directions. In some embodiments, multiple layers of additional build-up material 1602, 1902 and sets

1702, 2002 of second vias 118 may be formed at the first side 108 of the semiconductor package 102. In at least one embodiment, pattern plating 1802 may be formed between some of the second vias 118. In at least one embodiment, the first end 120 of a second via 118 may contact the conductive pad 904. In at least one embodiment, the first end 120 of a second via 118 may contact the metal plating 204. In at least one embodiment, the first end 120 of a second via 118 may contact the second end 122 of a second via 118. In some embodiments, the first via 112 and the second via 118 may form inverse shapes of each other.

At block 2320, an electrolytic connector 124 may be disposed at the semiconductor package first side 108 and electrically coupled to a second via 118. In some embodiments, the electrolytic connector 124 may be connected to the second side 122 of a second via 118. In at least one embodiment, the electrolytic connector 124 may be a solder bump 2010. In some embodiments, the electrolytic connector may be a copper pillar 126. In at least one embodiment, the copper pillar 126 may include a solder bump 128.

At block 2322 the die 104 may be attached to the semiconductor package 102 at the electrolytic connector 124. In at least one embodiment, solder reflow may be used to electrically couple the die 104 to the semiconductor package 102. At block 2324, the flattening device 1204, 2210 may be removed from the semiconductor package second side 110, since the attachment to the die 104 will keep the semiconductor package 102 flat. In some embodiments, what results from the method 2300 is a coreless embedded bridge interconnect semiconductor package 102 electrically coupled to a die 104. In at least one embodiment, what results from the method 2300 is an integrated circuit assembly 100. In some embodiments, the semiconductor package first side 108 may achieve the necessary coplanarity for ensuring a successful coupling to the die 104, due to using the sacrificial core 202, the flattening device 1204, 2210, a combination of these, or the like. In some embodiments, at least one component 2212 of the flattening device 2210 may be removed before the die 104 is attached to the semiconductor package 102.

Figure 24:
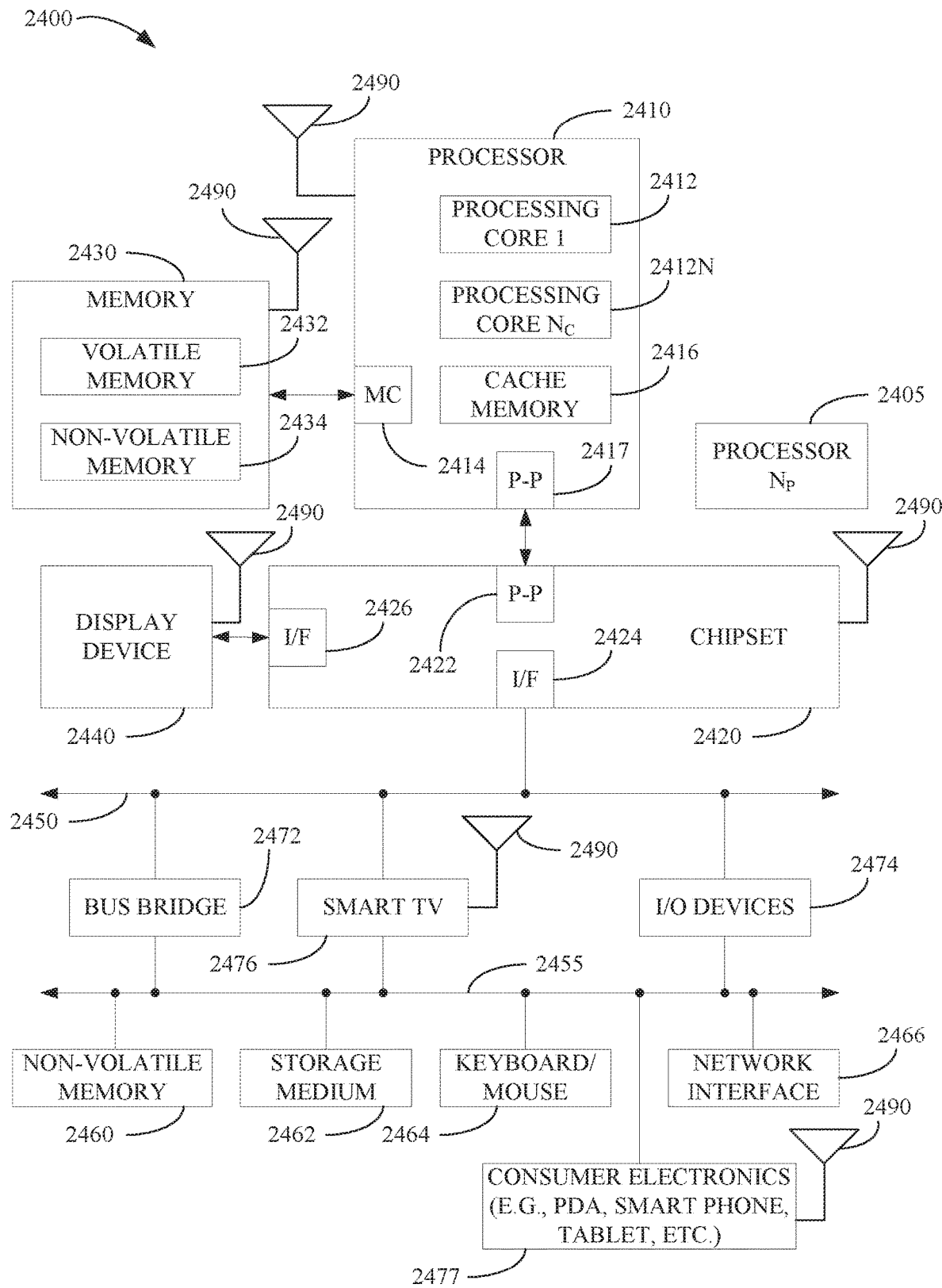
FIG. 24 is a block diagram of an example computing device that may include one or more of any of the semiconductor packages disclosed herein.

FIG. 24 illustrates a system level diagram, according to at least one embodiment. For instance, FIG. 24 depicts an example of an electronic device (e.g., system) including the integrated circuit assembly as described herein with reference to FIGS. 1-23. FIG. 24 is included to show an example of a higher level device application for the present invention. In one embodiment, system 2400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 2400 is a system on a chip (SOC) system.

In one embodiment, processor 2410 has one or more processing cores 2412 and 2412N, where 2412N represents the Nth processor core inside processor 2410 where N is a positive integer. In one embodiment, system 2400 includes multiple processors including 2410 and 2405, where processor 2405 has logic similar or identical to the logic of processor 2410. In some embodiments, processing core 2412 includes, but is not limited to, pre-fetch logic to fetch instructions, decode logic to decode the instructions, execution logic to execute instructions and the like. In some embodiments, processor 2410 has a cache memory 2416 to cache instructions and/or data for system 2400. Cache memory 2416 may be organized into a hierarchal structure including one or more levels of cache memory.

In some embodiments, processor 2410 includes a memory controller 2414, which is operable to perform functions that enable the processor 2410 to access and communicate with memory 2430 that includes a volatile memory 2432 and/or a non-volatile memory 2434. In some embodiments, processor 2410 is coupled with memory 2430 and chipset 2420. Processor 2410 may also be coupled to a wireless antenna 2490 to communicate with any device configured to transmit and/or receive wireless signals. In one embodiment, the wireless antenna interface 2490 operates in accordance with, but is not limited to, the IEEE 2402.11 standard and its related family, Home Plug AV (HPAV), Ultra Wide Band (UWB), Bluetooth. WiMax. or any form of wireless communication protocol.

In some embodiments, volatile memory 2432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 2434 includes, but is not limited to, flash memory, phase change memory (PCM), read-only memory (ROM), electrically erasable programmable read-only memory (EEPROM), or any other type of non-volatile memory device.

Memory 2430 stores information and instructions to be executed by processor 2410. In one embodiment, memory 2430 may also store temporary variables or other intermediate information while processor 2410 is executing instructions. In the illustrated embodiment, chipset 2420 connects with processor 2410 via Point-to-Point (PtP or P-P) interfaces 2417 and 2422. Chipset 2420 enables processor 2410 to connect to other elements in system 2400. In some embodiments of the invention, interfaces 2417 and 2422 operate in accordance with a PtP communication protocol such as the Intel QuickPath Interconnect (QPI) or the like. In other embodiments, a different interconnect may be used.

In some embodiments, chipset 2420 is operable to communicate with processor 2410, 2405N, display device 2440, and other devices 2472, 2476, 2474, 2460, 2462, 2464, 2466, 2477, etc. Chipset 2420 may also be coupled to a wireless antenna 2490 to communicate with any device configured to transmit and/or receive wireless signals.

Chipset 2420 connects to display device 2440 via interface 2426. Display 2440 may be, for example, a liquid crystal display (LCD), a plasma display, cathode ray tube (CRT) display, or any other form of visual display device. In some embodiments of the invention, processor 2410 and chipset 2420 are merged into a single SOC. In addition, chipset 2420 connects to one or more buses 2450 and 2455 that interconnect various elements 2474, 2460, 2462, 2464, and 2466. Buses 2450 and 2455 may be interconnected together via a bus bridge 2472. In one embodiment, chipset 2420 couples with a non-volatile memory 2460, a mass storage device(s) 2462, a keyboard/mouse 2464, and a network interface 2466 via interface 2424 and/or 2404, smart TV 2476, consumer electronics 2477, etc.

In one embodiment, mass storage device 2462 includes, but is not limited to, a solid state drive, a hard disk drive, a universal serial bus flash memory drive, or any other form of computer data storage medium. In one embodiment, network interface 2466 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 2402.11 standard and its related family. Home Plug AV (HPAV). Ultra Wide Band (UWB). Bluetooth. WiMax, or any form of wireless communication protocol.

While the modules shown in FIG. 24 are depicted as separate blocks within the system 2400, the functions performed by some of these blocks may be integrated within a single semiconductor circuit or may be implemented using two or more separate integrated circuits. For example, although cache memory 2416 is depicted as a separate block within processor 2410, cache memory 2416 (or selected aspects of 2416) can be incorporated into processor core 2412.

EXAMPLES

The following examples pertain to further embodiments.

Example 1 is a semiconductor package comprising: a semiconductor package first side; a semiconductor package second side opposite the semiconductor package first side; an interconnect embedded in a first build-up material; a first via extending through the first build-up material, the first via including a first end that is narrower than a second end of the first via, wherein a distance between the first end of the first via and the semiconductor package first side is less than a distance between the second end of the first via and the semiconductor package first side; and a second via extending through a second build-up material, the second via including a first end that is narrower than a second end of the second via, wherein a distance between the second end of the second via and the semiconductor package first side is less than a distance between the first end of the second via and the semiconductor package first side.

In Example 2, the subject matter of Example 1 optionally includes wherein the first build-up material and the second build-up material comprise the same material.

In Example 3, the subject matter of any one or more of Examples 1-2 optionally include wherein the interconnect includes: an interconnect first side with a first conductive pad; and an interconnect second side opposite the interconnect first side; wherein a distance between the interconnect first side and the semiconductor package first side is less than a distance between the interconnect second side and the semiconductor package first side; wherein the second via extends from the first conductive pad toward the semiconductor package first side.

In Example 4, the subject matter of any one or more of Examples 1-3 optionally include an electrolytic connector disposed at the semiconductor package first side and electrically coupled to the second via.

In Example 5, the subject matter of Example 4 optionally includes wherein the electrolytic connector comprises a solder bump.

In Example 6, the subject matter of Example 5 optionally includes wherein the electrolytic connector further comprises: solder plating disposed at the second side of the second via, wherein the solder plating is configured to form the solder bump responsive to reflow.

In Example 7, the subject matter of any one or more of Examples 5-6 optionally include wherein the electrolytic connector further comprises: a copper pillar disposed at the second side of the second via, wherein the solder bump is disposed on the copper pillar.

In Example 8, the subject matter of any one or more of Examples 1-7 optionally include a sacrificial core disposed between the semiconductor package and a second semiconductor package.

In Example 9, the subject matter of Example 8 optionally includes wherein at least a first portion of the semiconductor package first side has a profile complementary to a profile of a surface of the sacrificial core.

In Example 10, the subject matter of any one or more of Examples 1-9 optionally include wherein the semiconductor package first side is configured to electrically couple with one or more dies.

In Example 11, the subject matter of any one or more of Examples 1-10 optionally include wherein the interconnect includes a plurality of first conductive pads positioned at an interconnect first side.

In Example 12, the subject matter of any one or more of Examples 1-11 optionally include wherein the semiconductor package comprises a plurality of the first vias.

In Example 13, the subject matter of any one or more of Examples 1-12 optionally include wherein the semiconductor package comprises a plurality of the second vias.

In Example 14, the subject matter of any one or more of Examples 1-13 optionally include wherein the interconnect comprises a silicon bridge.

In Example 15, the subject matter of any one or more of Examples 1-14 optionally include a first conductive pad positioned at an interconnect first side; and a second conductive pad positioned at an interconnect second side.

In Example 16, the subject matter of Example 15 optionally includes a third via extending through the interconnect from the second conductive pad to the first conductive pad.

In Example 17, the subject matter of Example 16 optionally includes wherein the third via comprises a through-silicon via.

In Example 18, the subject matter of any one or more of Examples 1-17 optionally include wherein at least a first portion of the semiconductor package first side has a profile complementary to a profile of a surface of a sacrificial core.

In Example 19, the subject matter of any one or more of Examples 1-18 optionally include copper pattern plating electrically coupled with the second via.

Example 20 is an integrated circuit assembly, comprising: a first die; and a semiconductor package comprising: a semiconductor package first side; a semiconductor package second side opposite the semiconductor package first side; a bridge interconnect embedded in a first build-up material, the bridge interconnect including a bridge interconnect first side with a first conductive pad and a bridge interconnect second side opposite the bridge interconnect first side, wherein a distance between the bridge interconnect first side and the semiconductor package first side is less than a distance between the bridge interconnect second side and the semiconductor package first side; a first via extending through the first build-up material, the first via including a first end that is narrower than a second end of the first via, wherein a distance between the first end of the first via and the semiconductor package first side is less than a distance between the second end of the first via and the semiconductor package first side; and a second via extending through a second build-up material, the second via including a first end that is narrower than a second end of the second via, wherein the first end of the second via is positioned at the conductive pad at a face of the conductive pad opposite the bridge interconnect first side; wherein the first die is electrically coupled to the bridge interconnect via the second via.

In Example 21, the subject matter of Example 20 optionally includes an electrolytic connector formed at the second end of the second via, wherein the first die is electrically coupled to the to the bridge interconnect at the electrolytic connector.

In Example 22, the subject matter of Example 21 optionally includes wherein the electrolytic connector is selected from the group consisting of a solder bump and a copper pillar bump.

In Example 23, the subject matter of any one or more of Examples 20-22 optionally include a second conductive pad positioned at the bridge interconnect second side; and a third via extending through the bridge interconnect from the first conductive pad to the second conductive pad.

In Example 24, the subject matter of Example 23 optionally includes wherein the semiconductor package comprises an active bridge interconnect.

In Example 25, the subject matter of any one or more of Examples 23-24 optionally include a second die electrically coupled to the semiconductor package second side.

In Example 26, the subject matter of any one or more of Examples 23-25 optionally include a power supply configured to provide power to the bridge interconnect via the semiconductor package first side.

Example 27 is a method for manufacturing a semiconductor package, comprising: providing a interconnect embedded within a build-up material formed on a surface of a sacrificial core, the interconnect including a interconnect first side with a conductive pad and a interconnect second side opposite the interconnect first side, such that a distance between the interconnect first side and the surface is less than a distance between the interconnect second side and the surface; forming a first via in the build-up material, wherein the first via has a first end that is narrower than a second end of the first via, and the first end is closer to the surface than the second end is to the surface; removing the sacrificial core to expose the interconnect first side; providing additional build-up material at the interconnect first side; and forming a second via in the build-up material disposed at the interconnect first side, wherein the second via has a first end that is narrower than a second end, wherein the first end of the first via and the first end of the second via face opposite directions.

In Example 28, the subject matter of Example 27 optionally includes wherein providing the interconnect embedded within the build-up material formed on the surface of the sacrificial core further comprises: providing the build-up material on the surface of the sacrificial core; forming a cavity in the build-up material down to the surface of the sacrificial core; disposing the interconnect in the cavity; and providing additional build-up material to embed the interconnect.

In Example 29, the subject matter of any one or more of Examples 27-28 optionally include forming pattern plating that is electrically coupled to the second via.

In Example 30, the subject matter of any one or more of Examples 27-29 optionally include prior to removal of the sacrificial core, providing a temporary carrier on a side of the semiconductor package opposite the sacrificial core.

In Example 31, the subject matter of any one or more of Examples 28-30 optionally include after electrically coupling a die to the interconnect first side via the second via, removing the temporary carrier.

In Example 32, the subject matter of any one or more of Examples 27-31 optionally include wherein forming the first via and the second via, further comprises: forming the first via such that a distance between the first end of the first via and a semiconductor first side is less than a distance between the second side of the first via and the semiconductor package first side; and forming the second via such that a distance between the first side of the second via and the semiconductor package first side is greater than a distance between the second side of the second via and the semiconductor package first side.

In Example 33, the subject matter of Example 32 optionally includes wherein a distance between the interconnect first side and the semiconductor package first side is less than a distance between the interconnect second side and the semiconductor package first side.

Example 34 is a method of manufacturing an integrated circuit assembly, comprising: providing a semiconductor package, comprising: a semiconductor package first side; a semiconductor package second side; a bridge interconnect embedded in a build-up material, the bridge interconnect including a bridge interconnect first side including a conductive pad, and a bridge interconnect second side opposite the bridge interconnect first side, wherein a distance between the bridge interconnect first side and the semiconductor package first side is less than a distance between the bridge interconnect second side and the semiconductor package first side; a first via extending through a portion of the build-up material, the first via including a first end that is narrower than a second end of the first via, wherein a distance between the first end of the first via and the semiconductor package first side is less than a distance between the second end of the first via and the semiconductor package first side; attaching a flattening device to the semiconductor package to hold the semiconductor package first side flat; providing additional build-up material at the bridge interconnect first side; forming a second via extending through the additional build-up material, the second via including a first end that is narrower than a second end of the second via, wherein a distance between the second end of the second via and the semiconductor package first side is less than a distance between the first end of the second via and the semiconductor package first side; and attaching a die to the semiconductor package first side while the flattening device is holding the semiconductor package first side flat.

In Example 35, the subject matter of Example 34 optionally includes wherein attaching the flattening device to the semiconductor package comprises: prior to forming the second via, attaching a temporary carrier to the semiconductor package second side.

In Example 36, the subject matter of Example 35 optionally includes wherein the temporary carrier is selected from the group consisting of a sacrificial core and a glass carrier.

In Example 37, the subject matter of any one or more of Examples 34-36 optionally include wherein attaching the flattening device to the semiconductor package comprises attaching a vacuum jig to the semiconductor package.

In Example 38, the subject matter of Example 37 optionally includes wherein attaching the flattening device to the semiconductor package comprises: attaching a first vacuum jig component to the semiconductor package first side; attaching a second vacuum jig component to the semiconductor package second side; and prior to attaching the die to the semiconductor package first side, removing the first vacuum jig component from the semiconductor package first side.

In Example 39, the subject matter of any one or more of Examples 34-38 optionally include wherein attaching the die to the semiconductor package first side comprises performing a thermal compression bonding process.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third." etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A semiconductor package comprising:
    a semiconductor package first side, wherein at least a first portion of the semiconductor package first side has a profile complementary to a profile of a surface of a sacrificial core;
    a semiconductor package second side opposite the semiconductor package first, side;
    an interconnect embedded in a first build-up material, wherein the first build-up material is between the semiconductor package first side and the semiconductor package second side;
    a first via extending through the first build-up material, the first via including a first end that is narrower than a second end of the first via, wherein a distance between the first end of the first via and the semiconductor package first side is less than a distance between the second end of the first via and the semiconductor package first side, wherein the first via was formed prior to removal of the sacrificial core; and
    a second via extending through a second build-up material, the second via including a first end that is narrower than a second end of the second via, wherein a distance between the second end of the second via and the semiconductor package first side is less than a distance between the first end of the second via and the semiconductor package first side, wherein the second via was formed subsequent to removal of the sacrificial core.

2. The semiconductor package of claim 1, wherein the first build-up material and the second build-up material comprise the same material.

3. The semiconductor package of claim 1, wherein the interconnect includes:
    an interconnect first side with a first conductive pad; and
    an interconnect second side opposite the interconnect first side;
    wherein a distance between the interconnect first side and the semiconductor package first side is less than a distance between the interconnect second side and the semiconductor package first side;
    wherein the second via extends from the first conductive pad toward the semiconductor package first side.

4. The semiconductor package of claim 1, further comprising:
    an electrolytic connector disposed at the semiconductor package first side and electrically coupled to the second via.

5. The semiconductor package of claim 4, wherein the electrolytic connector comprises a solder bump.

6. The semiconductor package of claim 5, wherein the electrolytic connector further comprises:
    solder plating disposed at the second side of the second via, wherein the solder plating is configured to form the solder bump responsive to reflow.

7. The semiconductor package of claim 5, wherein the electrolytic connector further comprises:
    a copper pillar disposed at the second side of the second via, wherein the solder bump is disposed on the copper pillar.

8. The semiconductor package of claim 1, wherein the semiconductor package first side is configured to electrically couple with one or more dies.

9. The semiconductor package of claim 1, further comprising:
    a first conductive pad positioned at an interconnect first side; and
    a second conductive pad positioned at an interconnect second side.

10. The semiconductor package of claim 9, further comprising:
    a third via extending through the interconnect from the second conductive pad to the first conductive pad.

11. The semiconductor package of claim 10, wherein the third via comprises a through-silicon via.

12. The semiconductor package of claim 1, further comprising:
copper pattern plating in electrical communication with the second via.

13. An integrated circuit assembly, comprising:
a first die; and
a semiconductor package comprising:
  a semiconductor package first side, wherein at least a portion of the semiconductor package first side has a profile complementary to a profile of a surface of a sacrificial core;
  a semiconductor package second side opposite the semiconductor package first side;
  a bridge interconnect embedded in a first build-up material, the first build-up material positioned between the semiconductor package first side and the semiconductor package second side, the bridge interconnect including a bridge interconnect first side with a first conductive pad and a bridge interconnect second side opposite the bridge interconnect first side, wherein a distance between the bridge interconnect first side and the semiconductor package first side is less than a distance between the bridge interconnect second side and the semiconductor package first side;
  a first via extending through the first build-up material, the first via including a first end that is narrower than a second end of the first via, wherein a distance between the first end of the first via and the semiconductor package first side is less than a distance between the second end of the first via and the semiconductor package first side; and
  a second via extending through a second build-up material, the second via including a first end that is narrower than a second end of the second via, wherein the first end of the second via is positioned at the conductive pad at a face of the conductive pad opposite the bridge interconnect first side;
wherein the first die is electrically coupled to the bridge interconnect via the second via.

14. The integrated circuit assembly of claim 13, further comprising:
an electrolytic connector formed at the second end of the second via, wherein the first die is electrically coupled to the to the bridge interconnect at the electrolytic connector.

15. The integrated circuit assembly of claim 14, wherein the electrolytic connector is selected from the group consisting of a solder bump and a copper pillar bump.

16. The integrated circuit assembly of claim 13, further comprising:
a second conductive pad positioned at the bridge interconnect second side; and
a third via extending through the bridge interconnect from the first conductive pad to the second conductive pad.

17. The integrated circuit assembly of claim 16, wherein the semiconductor package comprises an active bridge interconnect.

18. The integrated circuit assembly of claim 16, further comprising:
a second die electrically coupled to the semiconductor package second side.

* * * * *